United States Patent
Li et al.

(10) Patent No.: US 8,002,020 B2
(45) Date of Patent: Aug. 23, 2011

(54) HEAT DISSIPATION ASSEMBLY WITH STRETCHABLE FASTENERS

(75) Inventors: Min Li, Shenzhen (CN); Lei Cao, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 521 days.

(21) Appl. No.: 12/200,870

(22) Filed: Aug. 28, 2008

(65) Prior Publication Data

US 2009/0236075 A1    Sep. 24, 2009

(30) Foreign Application Priority Data

Mar. 21, 2008   (CN) .......................... 2008 1 0066153

(51) Int. Cl.
*F28F 7/00*     (2006.01)
*H05K 7/20*    (2006.01)
(52) U.S. Cl. .......................... 165/80.3; 165/67; 361/719
(58) Field of Classification Search .................. 165/80.2, 165/80.3, 185, 104.33, 67, 76, 79; 257/718, 257/719; 361/679.54, 679.58, 704, 719, 361/720; 24/453, 458; 248/510
See application file for complete search history.

(56) References Cited

U.S. PATENT DOCUMENTS

| | | | |
|---|---|---|---|
| 5,844,777 A | 12/1998 | Gates | |
| 6,098,938 A * | 8/2000 | Tsai | 248/200 |
| 6,392,889 B1 * | 5/2002 | Lee et al. | 361/704 |
| 6,795,317 B1 * | 9/2004 | Liu | 361/704 |
| 7,099,156 B2 * | 8/2006 | Chen et al. | 361/719 |
| 7,430,122 B2 * | 9/2008 | Li | 361/719 |
| 7,480,144 B2 * | 1/2009 | Li | 361/704 |
| 2003/0184971 A1 | 10/2003 | Wu | |
| 2008/0106869 A1 * | 5/2008 | Li | 361/704 |
| 2008/0112138 A1 * | 5/2008 | Lin | 361/704 |

FOREIGN PATENT DOCUMENTS

| | | |
|---|---|---|
| CN | 1191338 | 8/1998 |
| CN | 1262464 | 8/2000 |

* cited by examiner

*Primary Examiner* — Tho V Duong
(74) *Attorney, Agent, or Firm* — Frank R. Niranjan

(57) ABSTRACT

A heat dissipation assembly comprises a heat sink for being disposed on an electronic component mounted on a printed circuit board, and a pair of fasteners for securing the heat sink on the printed circuit board. Each fastener comprises a sleeve extending through the printed circuit board, a latch received in the sleeve, a stretchable pole inserted through the sleeve and a handle pivotably fixed to the pole. The pole is raised by rotation of the handle to a locked position. At the locked position, the handle downwardly acts on the heat sink, and the pole pushes the latch out of the sleeve. The latch presses against the printed circuit board upwardly to realize an intimate contact between the heat sink and the electronic component.

17 Claims, 5 Drawing Sheets

HEAT DISSIPATION ASSEMBLY WITH STRETCHABLE FASTENERS

BACKGROUND OF THE INVENTION

1. Field of the Invention

The present invention relates to a heat dissipation assembly, and more particularly to a heat dissipation assembly having stretchable fasteners which can be utilized for a long period.

2. Description of related art

As the development of the electronic technology, more and more transistors are integrated into a single electronic component so that the single electronic component can perform multiple functions at a high speed. However, due to the high speed operation, heat generated by the electronic component is increased dramatically, which would significantly affect a normal operation of the electronic component if the heat cannot be removed timely; thus, how to effectively dissipate the heat from the electronic component becomes a challenge.

Conventionally, a heat sink is mounted on the electronic component to derive heat from the electronic component and dissipate the heat to an atmosphere ambient. Accordingly, a clip is needed to secure the heat sink on a printed circuit board where the electronic component is mounted, to insure the heat sink firmly and stably standing on the electronic component. A commonly used clip is a wire-type clip, which is welcome for its relatively simple configuration and less manufacturing process. As being used, two ends of the wire clip are respectively fixed to the printed circuit board on two sides of the heat sink, and a central portion of the wire clip is then wrested to abut against the heat sink, to thereby press the heat sink against the electronic component intimately.

Nevertheless, due to the wire clip being made of some rigid metal material, such as iron or copper, it has a poor capacity of withstanding twisting. After being deformed many times, the wire clip forms cracks therein. The cracks would result in loss of resilience of the wire clip, whereby the wire clip is not capable of securely fixing the heat sink on the electronic component any more. Even worse, such cracks may lead to a rupture of the wire clip, thus significantly reducing a life span of the clip unexpectedly.

What is needed, therefore, is a heat dissipation assembly which can overcome the above-mentioned disadvantages.

SUMMARY OF THE INVENTION

A heat dissipation assembly comprises a heat sink for being disposed on an electronic component mounted on a printed circuit board, and a pair of fasteners for securing the heat sink on the printed circuit board. Each fastener comprises a sleeve extending through the printed circuit board, a latch received in the sleeve, a stretchable pole inserted through the sleeve, and a handle pivotably fixed to the pole and abutting against a top face of an ear of the heat sink. The pole is raised by a rotation of the handle which downwardly acts on the heat sink, to push a part of the latch projecting out of the sleeve. The projected part of the latch presses against the printed circuit board upwardly. Under the mutual actions of the fasteners, an intimate contact between the heat sink and the electronic component is thus achieved. Compared with the conventional fastener securing the heat sink by twisting a wire clip, the stretchable pole of the fastener of the present invention can be utilized longer, and a life span of the fastener is accordingly extended.

Other advantages and novel features of the present invention will become more apparent from the following detailed description when taken in conjunction with the accompanying drawings.

BRIEF DESCRIPTION OF THE DRAWINGS

Many aspects of the present apparatus can be better understood with reference to the following drawings. The components in the drawings are not necessarily drawn to scale, the emphasis instead being placed upon clearly illustrating the principles of the present apparatus. Moreover, in the drawings, like reference numerals designate corresponding parts throughout the several views.

DETAILED DESCRIPTION OF THE INVENTION

Figure 1:
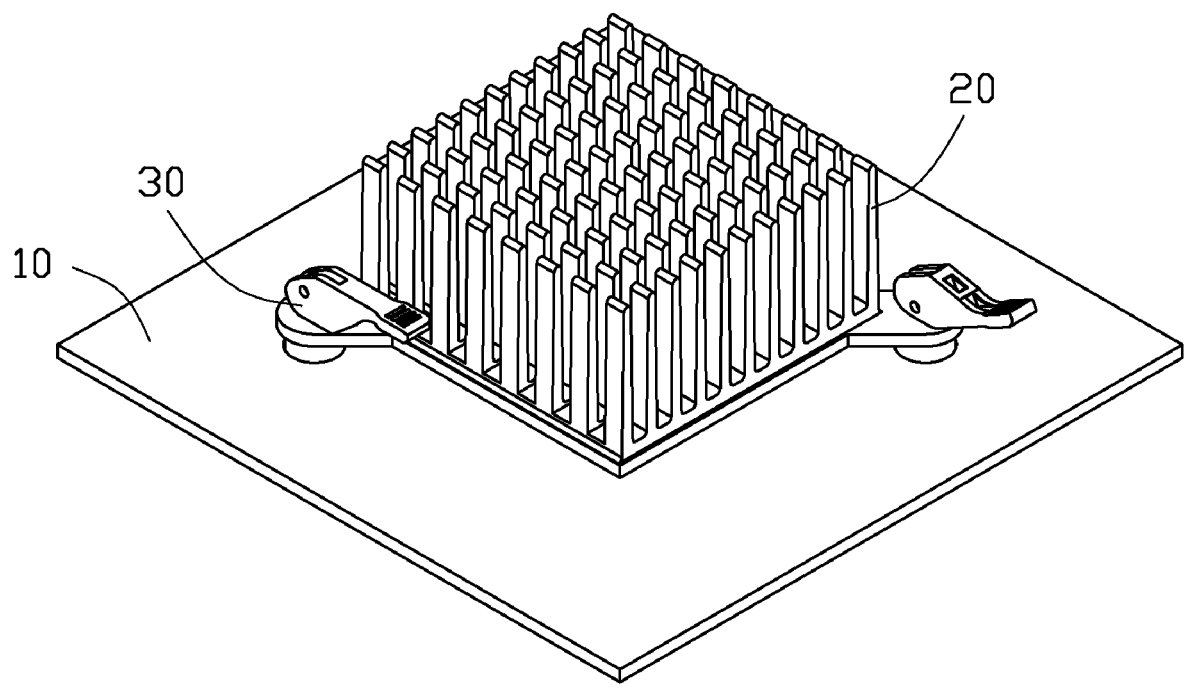
FIG. 1 is an assembled, perspective view of a heat dissipation assembly in accordance with a preferred embodiment of the present invention, with a printed circuit board and an electronic component mounted therebelow.
Figure 2:
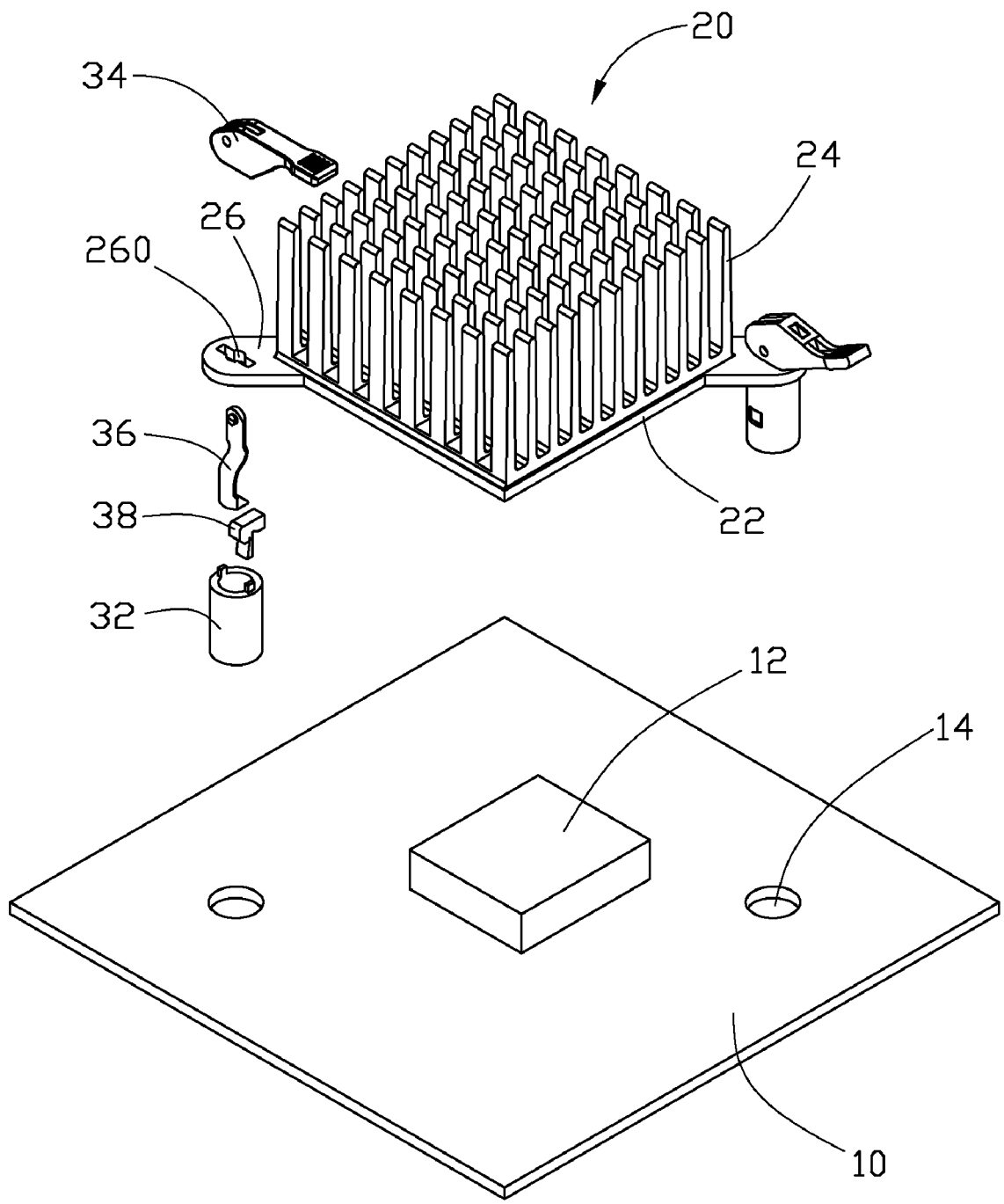
FIG. 2 is an exploded view of FIG. 1.

Referring to FIGS. 1-2, a heat dissipation assembly (not labeled) in accordance with a preferred embodiment of the present invention is used to be mounted on an electronic component 12 to dissipate heat therefrom. The electronic component 12 lays on a center of a printed circuit board 10 with two through holes 14 defined at two opposite corners thereof.

The heat dissipation assembly comprises a heat sink 20 seated on the electronic component 12 and a pair of fasteners 30 located at two opposite corners of the heat sink 20 to secure the heat sink 20 on the printed circuit board 10. The heat sink 20 is made of a heat conducting material, such as aluminum, copper or an alloy thereof. The heat sink 20 includes a square base 22, a pair of ears 26 extending horizontally and outwardly from two opposite corners of the base 22 and a plurality of fins 24 extending upwardly and vertically from a top face of the base 22. A bottom face of the base 22 engages a top face of the electronic component 12, thereby conducting heat generated by the electronic component 12 to the fins 24. Each ear 26 has a semicircular end (not labeled) located remote from the base 22. A slot 260 is defined in the ear 26 near the semicircular end and located corresponding to one of the through holes 14 in the printed circuit board 10. The slot 260 consists of a central circular part, and a pair of rectangular parts (not labeled) extending oppositely from the central circular part for extension of the fastener 30 therethrough. The fins 24 are divided by a plurality of mutually crossed grooves (not labeled) to be uniformly distributed on the top face of the base 22, thus offering sufficient channels for an airflow therethrough.

Figure 3:
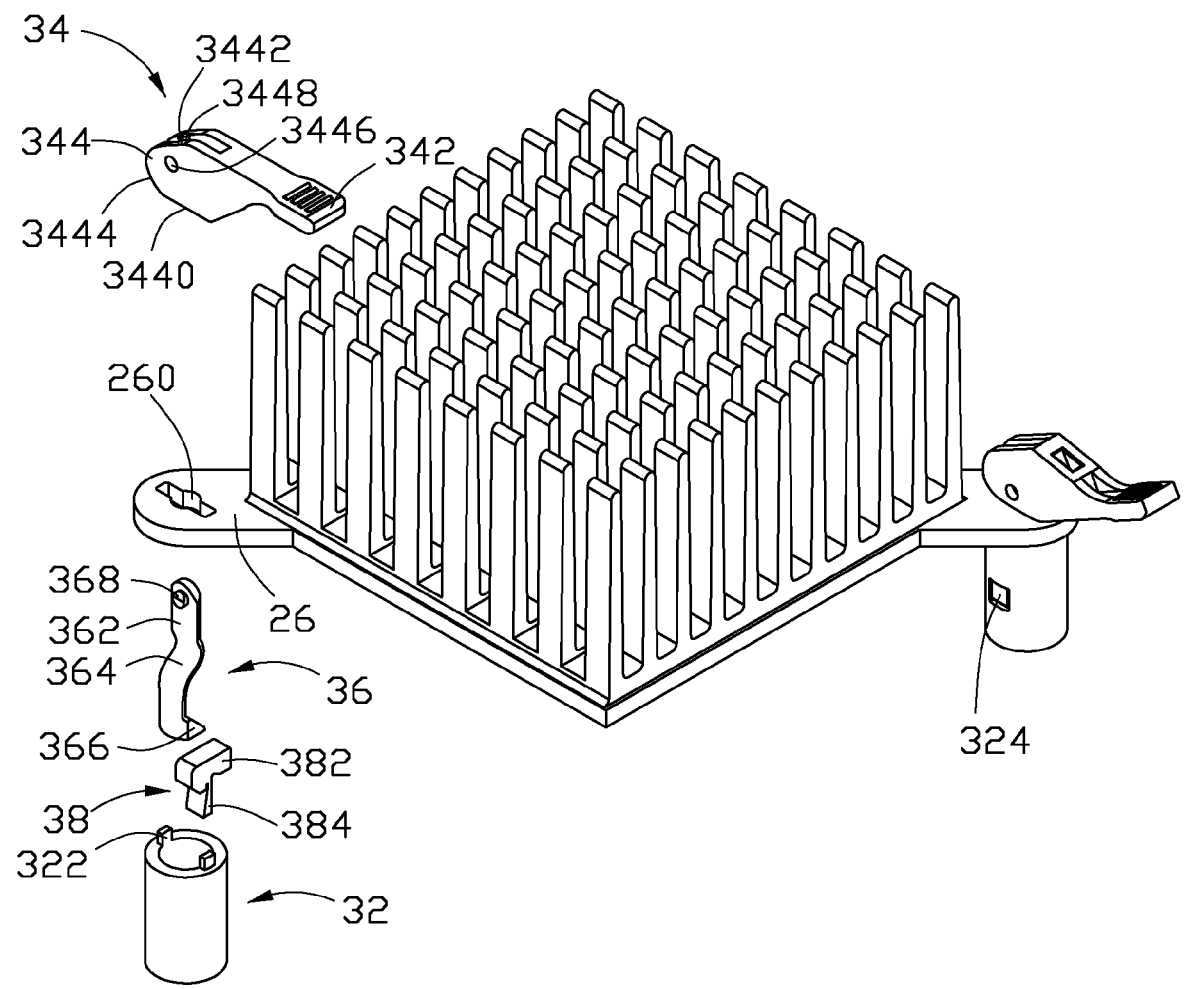
FIG. 3 is an enlarged view of the heat dissipation assembly of FIG. 2.

Also as viewed from FIG. 3, each fastener 30 comprises a sleeve 32 for extending through the printed circuit board 10, a pole 36 for being inserted in the sleeve 32, a handle 34 for being pivotably attached to the pole 36, and a latch 38 for being accommodated in the sleeve 32. The sleeve 32 is in the form of a hollow column and has two opposing protrusions 322 formed at a top portion thereof, and a square window 324 opened at a lower portion thereof. The two opposing protrusions 322 are formed for being fitted into the two rectangular parts of the slot 260 in each ear 26 respectively, for confining the sleeve 32 from rotating with respect to the base 22, when the fastener 30 is assembled to the heat sink 20.

Figure 4:
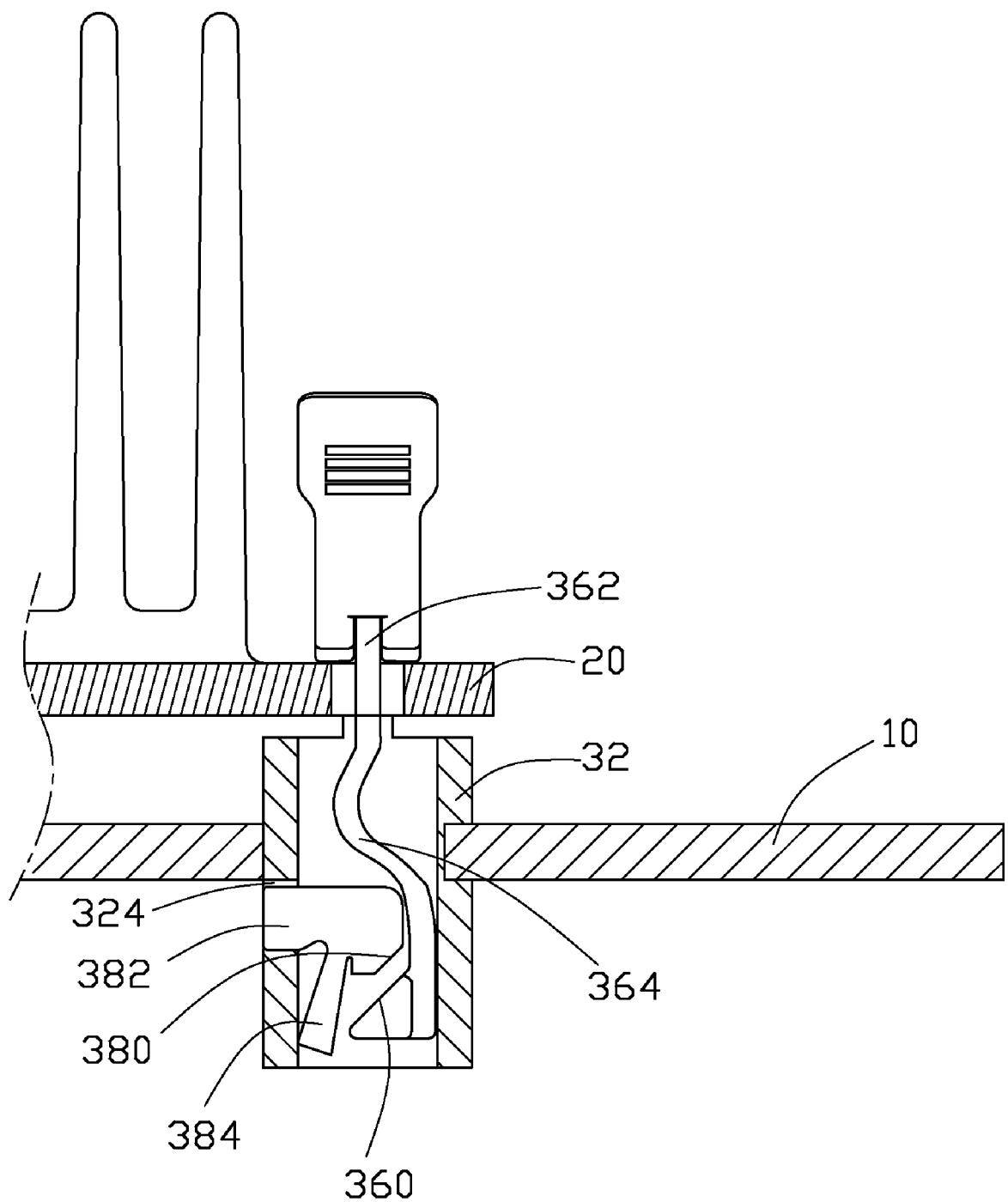
FIG. 4 is an enlarged sectional view of a part of FIG. 1, wherein a fastener of the heat dissipation assembly is held in a released position.

Referring also to FIG. 4, the pole 36 is made of an elastic material, such as plastic. The pole 36 has a triangle lower portion 366, a curved middle portion 364, and a straight, rectangular upper portion 362. The lower portion 366 has an inclined lateral surface 360 (see FIG. 4) for matching the latch 38, thereby driving the latch 38 to move when the pole 36 is moved. The middle portion 364 is configured in an S-shaped configuration to obtain a considerable resilience, whereby the middle portion 364 is stretchable when subjecting to a pull force. The upper portion 362 is oriented vertically, and it has two posts 368 extending horizontally and oppositely from two sides of an upper part of the upper portion 362 of the pole 36. The two posts 368 are for extending through the slot 260 in the ear 26 of the base 22, and engaging in the handle 34, to thereby realize a pivoting engagement between the handle 34 and the pole 36.

The latch 38 is accommodated in the sleeve 32 and located corresponding to the window 324. The latch 38 includes a block 382 and a leg 384 extending downwardly and inclinedly from the block 382. The block 382 has a large end (not labeled) forming a slantwise lateral surface 380 (as viewed from FIG. 4) confronting the inclined lateral surface 360 of the lower portion 366 of the pole 36. The block 380 can be pushed by the lower portion 366 of the pole 36 to move toward the window 324 in the sleeve 32. An area of the slantwise lateral surface 380 of the block 38 is smaller than that of the inclined lateral surface 360 of the pole 36, whereby the block 382 can slide on the inclined lateral surface 360 of the pole 36 freely. The block 382 has a small end (not labeled) extending from the large end thereof for fitting into the window 324 in the sleeve 32. The small end of the block 382 can be pushed to protrude outside of the sleeve 32 via the window 324 to abut against the printed circuit board 10, by a push of the lower portion 366 of the pole 36 (referring to FIG. 5). The leg 384 is located between the small end and the large end of the block 382, and extended towards the small end of the block. The leg 384 can be driven by the pole 36 to resiliently engage an inner circumference of the sleeve 32 in an uprightly oriented manner, thus producing an elastic force on the block 382 which has an intention to force the block 382 moving backwardly away from the window 324. Thus, when the force of the pole 36 urging the block 382 is release, the block 382 is returned to its original position of FIG. 4.

The handle 34 is pivotably mounted on each ear 26 of the heat sink 20. The handle 34 comprises a gripe 342 and a pair of cams 344 extending from an extremity end of the gripe 342 in a parallel relationship. A gap (not labeled) is defined between the two cams 344 for receiving the upper portion 362 of the pole 36 therein. Each cam 344 has a planar first lateral face 3440, a flat second lateral face 3442 inclined relative to the first lateral face 3440, and a curved third lateral face 3444 in connection with the first lateral face 3440 and the second lateral face 3442. The first lateral face 3440 and the second lateral face 3442 are for exclusively and substantially contacting with a top face of each ear 26 in a face-contact manner, thus stably and reliably holding the handle 34 on the ear 26 at two different orientations. The third lateral face 3444 is for temporarily contacting with the top face of each ear 26 in a point-contact manner when the handle 34 is moved between the two orientations, thereby enabling the handle 34 to smoothly move between the two orientations. Each cam 344 therein defines a horizontal perforation 3446 in vicinity of the second lateral face 3442, in which the post 368 of the pole 36 is retained to achieve the pivoting joint between the handle 34 and the pole 36. A wedge-shaped recess 3448 extends through an inner part of the second lateral face 3442 to reach the perforation 3446. The recess 3448 has a caliber decreasing downwardly, for facilitating a slide of the post 368 of the pole 36 into the perforation 3446.

In assembly, the heat sink 20 is disposed on the electronic component 12 with two ears 26 thereof in alignment with the two through holes 14 in the printed circuit board 10, respectively. The sleeve 32 with the latch 38 received therein, is brought to extend through the through hole 14 in the printed circuit board 10 from a place below the printed circuit board 10. The protrusions 322 of the sleeve 32 are respectively retained into the two rectangular parts of the slot 260 in the ear 26 to prevent a rotation of the sleeve 32 in respect to the base 22. The pole 36 is inserted into the sleeve 32 with the lower portion 366 thereof located beneath the latch 38 and the upper portion 362 thereof extending through the through hole 14 in the printed circuit board 10 and located over the ear 26. The handle 34 is then disposed on the ear 26 of the heat sink 20 in a released position shown in FIG. 4, in a manner that the first lateral face 3440 thereof contacts the top face of the ear 26, and the perforations 3446 thereof engagingly receives the posts 368 of the pole 36.

Figure 5:
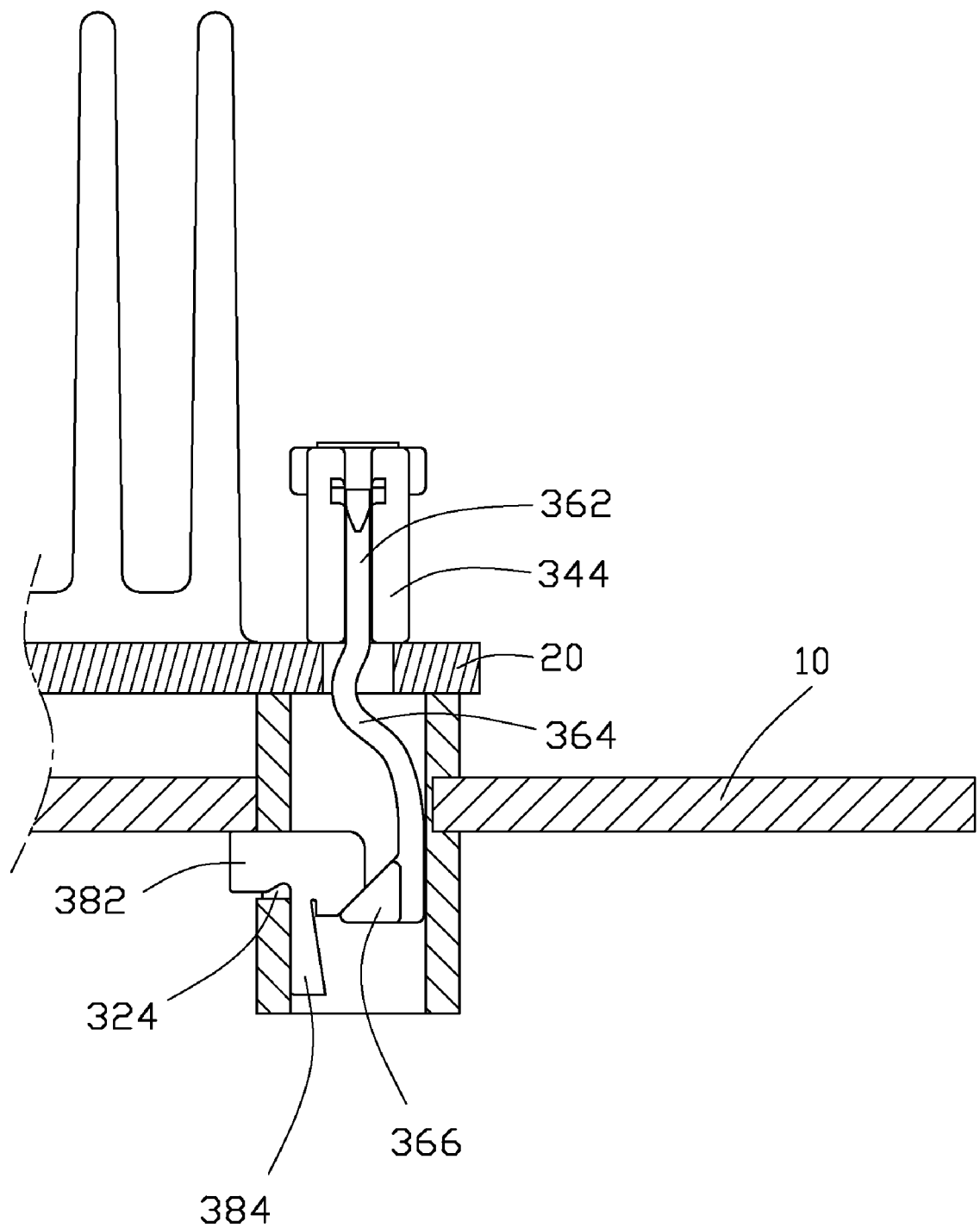
FIG. 5 is a view similar to FIG. 4, wherein the fastener of the heat dissipation assembly is rotated to a locked position.

Also as shown in FIG. 5, in use, the handle 34 is rotated from the released position to make the first lateral face 3440 thereof leaving the top face of the ear 26 and the third lateral face 3444 thereof starting contacting the top face of the ear 26, thus pressing the heat sink 20 downwardly. Due to an action of by the cams 344, the upper portion 362 of the pole 36 is pulled upwardly by a raise of the perforations 3446 in the handle 344 in which the posts 368 of the pole 36 are retained, and accordingly, the middle portion 364 of the pole 36 is stretched to bring the lower portion 366 of the pole 36 to move upwardly. During the upward movement of the pole 36, the inclined lateral surface 360 of the lower portion 366 starts to engage the slantwise lateral surface 380 of the block 382 of the latch 38. By push of the lower portion 366 of the pole 36, the block 382 is pushed outwardly toward the window 324 in the sleeve 32, wherein the small end of the block 382 projects out of the sleeve 32 to press against the bottom face of the printed circuit board 10. Simultaneously, the leg 384 of the latch 38 abuts against the inner circumference of the sleeve 32 and is pressed by the large end of the block 382 to be deformed. At the locked position of the handle 34 shown in FIG. 5, the second lateral face 3442 of the cam 344 contacts the top face of the ear 26 and the top face of the sleeve 32 engages a bottom face of the ear 26. Half of the small end of the block 382 of the latch 38 projects outside of the sleeve 32 and intimately presses against the bottom face of the printed circuit board 10 upwardly, and the leg 384 of the latch 38 is oriented vertically and reaches a maximal deformation thereof. Such a maximal deformation of the leg 384 exerts a relatively large resilient force acting on the block 382, to cause the block 382 to have a trend of moving backwardly away from the window 324 in the sleeve 32. However, due to being blocked by the lower portion 366 of the pole 36, the block 382 is prevented from moving backwardly, and the whole fastener 30 is maintained in a stable condition. Meanwhile, under mutual actions provided by the fasteners 30, i.e., the upward force on the printed circuit board 10 generated by the latches 38, and the downward force on the heat sink 20 produced by the handles 34, the heat sink 20 and the electronic component 12 are urged to contact each other intimately, and a good heat conduction from the electronic component 12 to the heat sink 20 is thus ensured.

The fastener 30 of the present invention employs a stretching-type configuration to substitute the twisting-type configuration of the conventional wire clip. On contrary to the twisting action on the wire clip, the stretching action would cause much less damage to the resilient plastic pole 36 at each time of manipulation; therefore, the fastener 30 of the present invention can withstand thousand operations, a reliability and a safety of the fastener 30 are thus insured, and a life span of the fastener 30 is accordingly prolonged.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation assembly for dissipating heat from an electronic component mounted on a printed circuit board, comprising:
    a heat sink for contacting the electronic component; and
    a pair of fasteners for fixing the heat sink on the printed circuit board, each comprising:
        a sleeve adapted for extending through the printed circuit board;
        a latch accommodated in the sleeve;
        a resilient pole retained in the sleeve and abutting against the latch; and
        a handle pivotably attached to the pole and adapted for pressing against the heat sink downwardly when the handle is pivoted to from an unlocked position to a locked position;
        wherein when the handle is moved to the locked position, the pole is driven by the handle to stretch upwardly to thereby press against the latch outwardly, a part of the latching being protruded out of the sleeve so as to press the printed circuit board upwardly.

2. The heat dissipation assembly as claimed in claim 1, wherein the pole comprises a lower portion abutting against the latch, an upper portion pivotably engaged with the handle, and an elastic middle portion interconnecting the lower portion and the upper portion.

3. The heat dissipation assembly as claimed in claim 2, wherein the lower portion of the pole has a triangle shape defining an inclined lateral surface for engaging with the latch.

4. The heat dissipation assembly as claimed in claim 3, wherein the latch comprises a block protruding out of the sleeve, and a leg extending downwardly and inclinedly from the block for abutting against an inner circumference of the sleeve when the handle is moved to the locked position.

5. The heat dissipation assembly as claimed in claim 4, wherein the block of the latch forms a slantwise lateral face for contacting the inclined lateral face of the lower portion of the pole.

6. The heat dissipation assembly as claimed in claim 2, wherein the handle raises the pole when the handle is moved from the unlocked position to the locked position.

7. The heat dissipation assembly as claimed in claim 6, wherein the handle comprises a gripe and a pair of cams extending from the gripe, the pair of cams rotatably contacting the heat sink to press the heat sink downwardly when the handle is moved from the unlocked position to the locked position.

8. The heat dissipation assembly as claimed in claim 7, wherein the pair of cams are parallel to each other and form a gap therebetween to receive the upper portion of the pole.

9. The heat dissipation assembly as claimed in claim 8, wherein each of the pair of cams has a flat first lateral side, a planar second lateral side and a curved third lateral side interconnecting the first lateral side and the second lateral side, each of the first lateral side and the second lateral side contacting the heat sink to hold the handle at a corresponding one of the unlocked and locked positions.

10. The heat dissipation assembly as claimed in claim 9, wherein the first lateral side and the second lateral side of the each of the pair of cams are inclined to each other.

11. The heat dissipation assembly as claimed in claim 2, wherein the heat sink comprises a base and a pair of ears extending outwardly from two opposite corners of the base, each ear defining a slot therein for extension of the upper portion of the pole therethrough.

12. The heat dissipation assembly as claimed in claim 1, wherein the sleeve forms a pair of protrusions at a top thereof, the pair of protrusions being inserted into the heat sink to prevent the sleeve from rotating with respect to the heat sink.

13. A fastener for securing a heat sink on a printed circuit board, comprising:
    an upright sleeve for extending through the printed circuit board;
    a latch received in the sleeve;
    a stretchable pole vertically extending through the sleeve; and
    a handle pivotably attached to the pole, adapted for pressing against the heat sink downwardly, wherein the handle is pivoted from a first orientation to a second orientation to pull the pole upwardly, at the second orientation of the handle, the pole pushing the latch to project horizontally out of the sleeve to be adapted for pressing against the printed circuit board upwardly.

14. The fastener as claimed in claim 13, wherein the first orientation is slantwise relative to the second orientation.

15. The fastener as claimed in claim 13, wherein the latch comprises a block retained horizontally in the sleeve, and a leg extending downwardly and inclinedly from the block to engage an inner periphery of the sleeve when the handle is at the second orientation.

16. The fastener as claimed in claim 15, wherein the block comprises a large end abutting against the latch and a small end projecting out of the sleeve, the leg being formed between the small end and the large end when the handle is at the second orientation.

17. The fastener as claimed in claim 13, wherein the pole comprises a triangle portion engaging the block of the latch, a tab portion pivotably fixed in the handle, and an S-shaped portion interconnecting the triangle portion and the tab portion, the S-shaped portion being stretched when the handle is at the second orientation.

* * * * *